United States Patent [19]
Talwar et al.

[11] Patent Number: 5,888,888
[45] Date of Patent: Mar. 30, 1999

[54] METHOD FOR FORMING A SILICIDE REGION ON A SILICON BODY

[75] Inventors: Somit Talwar; Guarav Verma, both of Palo Alto; Karl-Josef Kramer, Menlo Park; Kurt Weiner, San Jose, all of Calif.

[73] Assignee: Ultratech Stepper, Inc., San Jose, Calif.

[21] Appl. No.: 791,775

[22] Filed: Jan. 29, 1997

[51] Int. Cl.$^6$ .............................. H01L 21/22; H01L 21/24
[52] U.S. Cl. ........................ 438/533; 438/586; 438/592; 438/657; 438/661; 438/662
[58] Field of Search ..................................... 438/511, 533, 438/586, 592, 655, 657, 659, 661, 662, 158, 353, 360

[56] References Cited

U.S. PATENT DOCUMENTS

| | | | |
|---|---|---|---|
| 4,522,845 | 6/1985 | Powell et al. | 427/53.1 |
| 4,622,735 | 11/1986 | Shibata | 29/571 |
| 4,683,645 | 8/1987 | Naguib et al. | 437/41 |
| 4,830,971 | 5/1989 | Shibata | 437/29 |
| 4,924,294 | 5/1990 | Tanielian | 357/71 |
| 4,931,353 | 6/1990 | Tanielian | 437/200 |
| 5,010,032 | 4/1991 | Tang et al. | 437/57 |
| 5,094,977 | 3/1992 | Yu et al. | 438/655 |
| 5,122,479 | 6/1992 | Audet et al. | 437/200 |
| 5,236,865 | 8/1993 | Sandhu et al. | 438/533 |
| 5,302,549 | 4/1994 | Santagelo et al. | 438/533 |
| 5,405,806 | 4/1995 | Pfiester et al. | 437/200 |
| 5,563,100 | 10/1996 | Matsubara | 438/664 |
| 5,571,735 | 11/1996 | Mogami et al. | 437/41 |
| 5,593,923 | 1/1997 | Horiuchi et al. | 437/200 |
| 5,700,717 | 12/1997 | Nowak et al. | 437/192 |

FOREIGN PATENT DOCUMENTS 6-112158   4/1994   Japan .

OTHER PUBLICATIONS

Chu et al, "Contact Formation by Laser Annealing of Implanted Silicon", IBM Technical Disclosure Bulletin, vol. 22, No. 12, p. 5335, May 1980.

Moslehi, "Single–Wafer Optical Processing of Semiconductors: Thin Insulator Growth for Integrated Electronic Device Applications", Appl. Phys. A, vol. 46, pp. 255–273, 1988.

Roozeboom et al, "Rapid Thermal Processing Systems: A Review with Emphasis on Temperature Control", J. Vac. Sci. Technol. B, vol. 8, No. 6, pp. 1249–1259, Dec. 1990.

*Primary Examiner*—John F. Niebling
*Assistant Examiner*—Ha Tran Nguyen
*Attorney, Agent, or Firm*—Allston L. Jones

[57] ABSTRACT

The method of this invention produces a silicide region on a silicon body that is useful for a variety of purposes, including the reduction of the electrical contact resistance to the silicon body or an integrated electronic device formed thereon. The invented method includes the steps of producing an amorphous region on the silicon body using ion implantation, for example, forming or positioning a metal such as titanium, cobalt or nickel in contact with the amorphous region, and irradiating the metal with intense light from a laser source, for example, to cause metal atoms to diffuse into the amorphous region. The amorphous region thus becomes an alloy region with the desired silicide composition. Upon cooling after irradiation, the alloy region becomes partially crystalline. To convert the alloy region into a more crystalline form, the invented method preferably includes a step of treating the alloy region using rapid thermal annealing, for example. An insulator layer and a conductive lead can subsequently be patterned to establish electrical contact to the silicide region. The low contact resistivity of the silicide region provides the capability to transmit relatively high-frequency electronic signals through the contact region. In a preferred application, the invented method is used to form self-aligned silicide contact regions for the gate, source and drain of a metal-insulator-semiconductor field-effect transistor (MISFET).

32 Claims, 6 Drawing Sheets

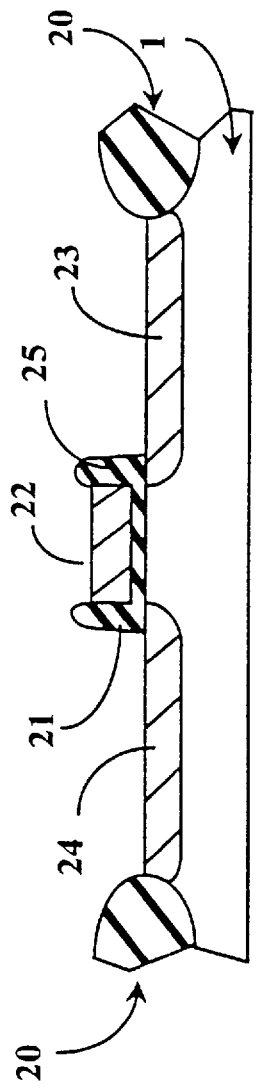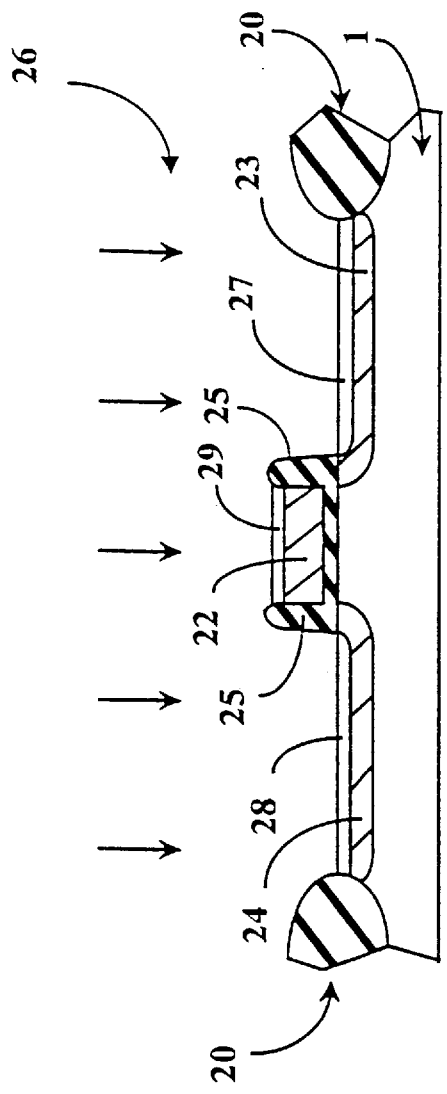

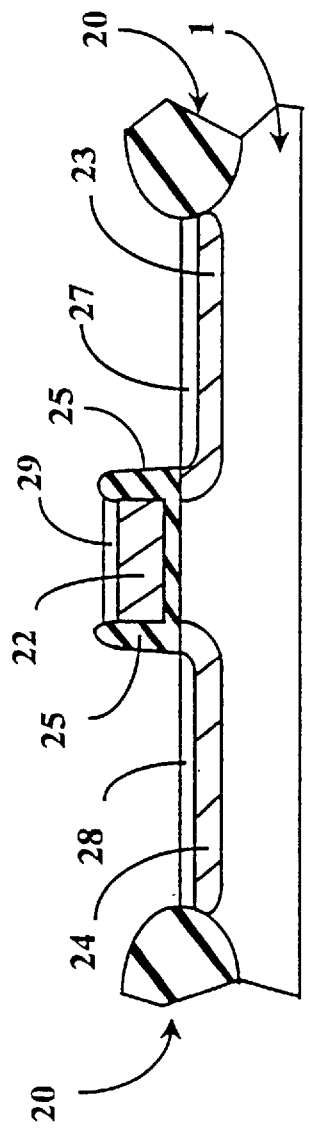
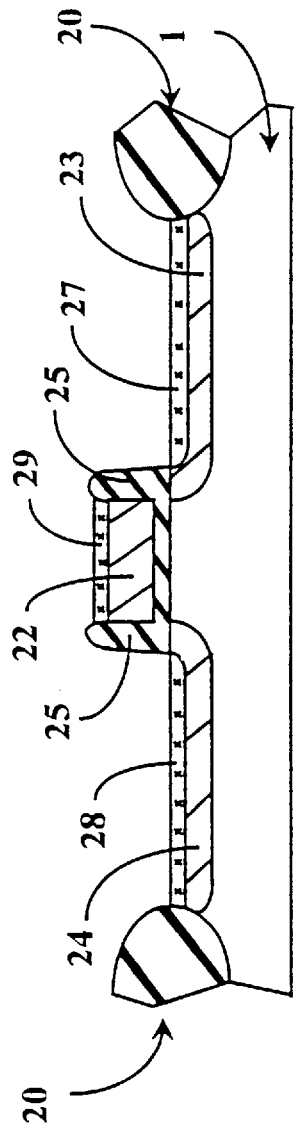
Fig. 2G
Fig. 2H

METHOD FOR FORMING A SILICIDE REGION ON A SILICON BODY

BACKGROUND OF THE INVENTION

1. Field of the Invention

This invention is directed to a method for forming a silicide region on a silicon body. Silicides have been used for a variety of purposes, most significantly for the reduction of contact resistances for electrical connections to integrated devices formed on silicon substrates. The reduced contact resistances provide the devices with the capability to operate at relatively high speeds.

2. Description of the Related Art

Many techniques have been developed for forming silicide regions for integrated device contacts, particularly for metal-oxide-semiconductor (MOS) devices formed on silicon substrates. Most of these techniques involve the formation of a metal layer over a gate, drain or source region upon which the silicide is desired to be formed. These techniques then use thermal treatment for extended periods of time to react the metal with the silicon composing the gate, drain and/or source regions, to form the low-resistivity silicide regions. The substrate is further processed by removing the metal layer, forming an electrically-insulating layer over the substrate, and forming conductive metal lines on the insulating layer, that contact silicide regions over the gate, source and drain regions to form the desired circuit connections for the integrated MOS device.

Techniques for forming suicides are subject to several stringent process constraints that must be met in order for such techniques to be effective. These constraints include: (1) the metal used to form the silicide must be carefully selected to be a species that diffuses into the silicon, to avoid the formation of leakage paths between the source, drain and gate of an integrated device; (2) for self-aligned silicidation techniques, the metal layer must not react with the insulative material composing the self-aligning side walls of the gate; (3) the dopants must not segregate into the silicide regions so that low contact resistance can be achieved; (4) the technique should have a process window that allows the silicide region to be formed on both c-silicon and poly-silicon; (5) the silicide formation should be insensitive to dopants present in the silicon; and (6) the metal atoms should not diffuse beyond the silicide regions to prevent increase in junction leakage. The simultaneous achievement of all of the above-stated criteria is at best difficult for most conventional silicidation techniques, especially those that use relatively extensive thermal treatments. Most often, a failure to perform the conventional technique within its relatively narrow process margins manifests itself in the occurrence of defects due to thermal drift of the metal atoms beyond desired boundaries during the relatively prolonged thermal treatment periods required by such techniques. If the silicide region extends beyond its design dimensions, it can cause leakage paths between the gate, source and drain. There is therefore a great need for a technique that enhances silicidation process margins beyond those conventionally available.

In addition to conventional techniques that use prolonged thermal treatments, some conventional silicidation techniques use ion implantation to achieve formation of the silicide regions. These ion-implantation silicidation techniques use either ion beam mixing of different ion types to produce a silicide of a desired composition, or implantation of a desired species of metal ions in a proportion needed to achieve proper stoichiometry. In either of these two types of techniques, the ion-implantation is so extensive as to be extremely time-consuming, especially if a stoichiometric proportion of ions needed to make the silicide must be implanted into the silicon substrate. In addition, extensive ion implantation will eventually lead to 'knock-on', a phenomenon in which moving ions strike ions previously implanted, driving them further than desired into the silicon substrate. The occurrence of knock-on leads to increased junction leakage. The silicidation resulting from the use of such conventional techniques can thus occur to so great a depth into the silicon substrate as to produce leakage paths between the terminals of the integrated circuit devices. Thus, there is an immense need for a technique that can overcome the above-noted disadvantages of conventional silicidation techniques.

SUMMARY OF THE INVENTION

This invention overcomes the above-noted disadvantages. The method of this invention includes a step of producing an amorphous region on a silicon body, a step of forming or positioning a metal layer in contact with the amorphous region, and a step of irradiating the metal layer with light to diffuse metal into the amorphous region to form an alloy region of silicide composition from the amorphous region. The step of producing the amorphous region in the silicon body is preferably performed through ion implantation. The depth to which the amorphous region is formed in the silicon body is determined and controlled with high accuracy by selection of the atomic weight of the ion species used for implantation, the implantation energy, and the dosage of ions implanted in the silicon body. Knock-on is not an issue because the amorphization implant is performed prior to metal deposition. The step of forming or positioning the metal layer on the amorphous region is preferably performed by sputtering, evaporating or depositing the metal onto the silicon body. The metal can be one of a large number of metals, including titanium, cobalt and nickel. The step of irradiating the metal layer is preferably accomplished with pulsed laser light with a power sufficient to render the amorphous region molten while the metal layer and the silicon body remain in their solid states, so that the molten amorphous region becomes an alloy region with silicide composition upon cooling after the irradiation step. To melt the amorphous region while the silicon body and the metal layer remain in their solid states, the fluence of the laser light used to irradiate the metal layer is preferably in a range from 0.1 to 1.0 Joules per square centimeter. The invented method can also include a step of treating the alloy region to convert it into a silicide region with a highly crystalline atomic structure. Preferably, the treating step of the first invented method is performed by rapid thermal annealing. In a preferred application, the invented method is used to form self-aligned silicide contacts for the gate, source and drain of a metal-insulator-semiconductor field-effect transistor (MISFET).

The method of this invention provides several advantages over conventional silicidation techniques. For example, in the methods of this invention, silicidation occurs only in the limited portion of the silicon body that is rendered amorphous through ion implantation so that the dimensions of the silicide region can be relatively strictly controlled to avoid the formation of leakage paths and other problems that would adversely impact the electronic characteristics of the silicon body and/or any integrated devices formed thereon. Further, the use of light to irradiate the metal layer to diffuse the metal into the amorphous region helps to reduce heating of the silicon body so that integrated devices formed on the silicon body are not subjected to prolonged heating that could otherwise damage such devices. In addition, the methods of this invention can be used to perform silicidation at a much faster rate compared to conventional silicidation techniques. The throughput for the silicidation of silicon bodies using the invented method is thus much greater than is possible with conventional silicidation techniques.

These together with other features and advantages, which will become subsequently apparent, reside in the details of construction and operation of the invention as more fully hereinafter described and claimed, reference being made to the accompanying drawings, forming a part hereof, wherein like numerals refer to like parts throughout the several views.

BRIEF DESCRIPTION OF THE DRAWINGS

FIGS. 2A through 2I are cross-sectional diagrams of a silicon body showing steps of the invented method as applied to self-aligned silicidation of the contacts for the gate, drain and source of an integrated MISFET device.

DESCRIPTION OF THE PREFERRED EMBODIMENTS

Figure 1A:
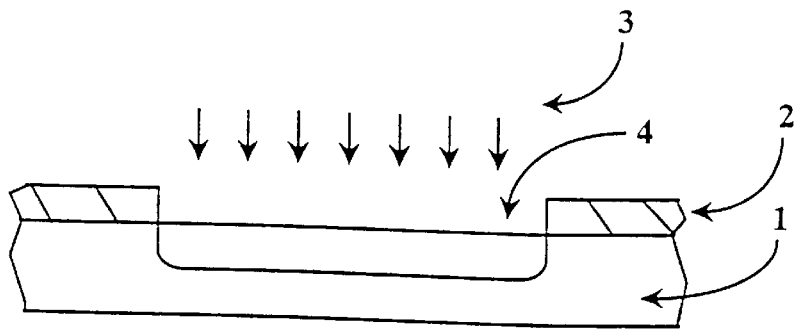
FIGS. 1A through 1E are cross-sectional diagrams of a silicon body showing steps to perform silicidation of the silicon body in accordance with a generalized method of this invention.

In FIG. 1A, a silicon body 1 is subjected to processing to form a silicide region in accordance with the invented method. The silicon body can be a silicon substrate, a silicon-on-insulator substrate, a silicon epitaxial layer, or c-silicon or poly-silicon used to form a gate for a MISFET device, for example. A resist layer 2 is formed on the surface of the body 1, and is patterned to form a window exposing the region of the silicon body in which it is desired to form the silicide region. As known to persons of ordinary skill in this technology, the resist layer can be any one of a variety of suitable substances patterned with a variety of well-known techniques.

In accordance with the method of this invention, the exposed portion of the silicon body is rendered amorphous, preferably through the implantation of ions denoted as numeral '3' in FIG. 1A. The implanted ions destroy the chemical bonds between silicon atoms in the substrate so that the atomic structure is made relatively disordered and random compared with the portions of the silicon body that are not subjected to ion bombardment. Preferably, the ion species, the implantation energy and the dosage are selected to produce the amorphized region 4 such that it extends to a predetermined depth. In general, selecting an ion species with a relatively light atomic weight, increasing the ion implantation energy, or increasing the ion dosage, will each have the effect of increasing the depth to which the amorphous region extends. Conversely, selecting an ion species with relatively heavy atomic weight, decreasing the ion implantation energy, or decreasing the ion dosage, will each have the effect of decreasing the depth to which the amorphous region extends. A number of ion species can be used to produce the amorphous region. For example, the ion species can include silicon, argon, arsenic, or germanium. The ion implantation energy can be in a range from 10 to 100 kilo-electronVolts (keV) at a dosage in a range from $10^{13}$ to $10^{15}$ ions per square centimeter. In the preferred embodiment, the depth to which the amorphized region extends into the silicon body is predetermined to be 300 Å. To produce the amorphized region to a depth of 300 Å, the inventors have determined that germanium ions implanted at an energy of about 20 keV with a dosage of about $3 \times 10^{14}$ atoms per square centimeter will achieve amorphization of the silicon body to this depth. The ion implantation can be performed with a device such as the 9500 XR Ion Implanter commercially available from Applied Materials, Inc. of San Jose, Calif. Preferably, the ion implantation is performed in a Projection-Gas Immersion Laser Annealing (P-GILA) machine commercially available from Ultratech Stepper, Inc. After ion implantation, the resist layer 2 is removed, for example, by chemical solvent, mechanical abrasion, and/or other techniques that are well-known to persons of ordinary skill in this technology.

If the silicon body is removed from the vacuum chamber in which ion implantation is performed, the body may be exposed to the atmosphere and thus to a degree of oxidation due to the atmosphere's oxygen content. The oxidation forms a so-called 'native' oxide layer over the surface of the silicon body. So that such native oxide layer will not adversely affect subsequent processing in accordance with the methods of this invention, the native oxide layer can be stripped with an acidic solution. For example, a solution of 1:100 ratio of HF to $H_2O$ strips oxide at a rate of 20 Å per minute. A thirty second treatment of the silicon body with the acidic solution is sufficient to remove the native oxide layer. In the alternative, the invented method can be practiced in a chamber so that the amorphous region is not exposed to an oxidizing environment before the formation of the metal layer thereon, thus altogether avoiding the formation of an oxide layer that would require removal.

Figure 1B:
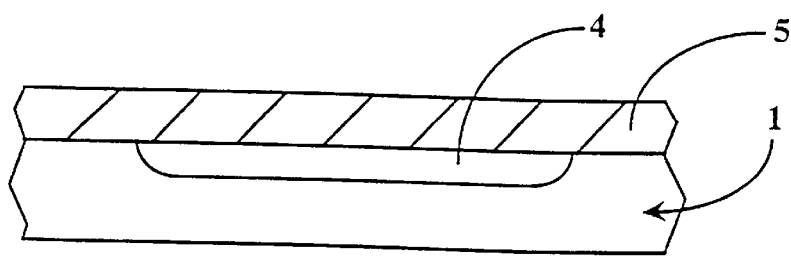

In FIG. 1B, a metal layer 5 is formed over the surface of at least the amorphous region 4. The metal layer supplies the metal atoms needed to form the desired silicide compound for electrical contact with the silicon body. With the invented method, a number of metal species can be used to form the silicide compound. For example, the metal layer can include titanium, cobalt or nickel used to form the silicides $TiSi_2$, $CoSi_2$, or NiSi with resistivities of 15–20 $\mu\Omega cm$, 17–20 $\mu\Omega cm$, and 12–15 $\mu Wcm$, respectively. The metal layer is formed preferably by sputtering, but evaporation or chemical vapor deposition can also be used. For example, to form the metal layer, a suitable sputtering chamber is the Endura VHPPVD commercially available from Applied Materials, Inc. of San Jose, Calif. Preferably, the metal layer is formed in a thickness determined based upon the desired silicide thickness or depth and the proportional amount of silicon and metal consumed to form the silicide. More specifically, the metal layer's thickness should be at least the desired silicide depth divided by the ratio of silicon-to-metal consumed to form the silicide. Thus, to form a $TiSi_2$ silicide region 300 Å in thickness in which, due to the atomic structure and bonding of this particular silicide, a 2.27 Å thickness of silicon is consumed per 1 Å thickness of titanium (i.e., a consumption ratio of 2.27), the thickness of the metal layer should be at least 300 Å/2.27 ≅130 Å to ensure that a stoichiometric quantity of metal will be available to form the desired silicide.

Figure 1C:
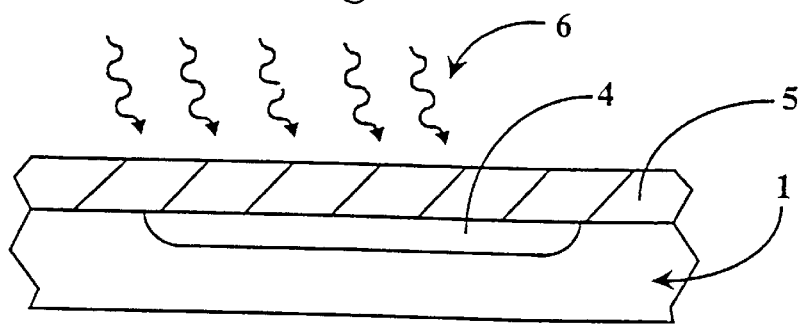

In FIG. 1C, the metal layer is irradiated with light designated numeral '6.' Preferably, the light is generated by a laser with sufficient power to render the amorphous region molten, and yet with insufficient power to melt the silicon body or the metal layer 5. Because the chemical bonds of the amorphous region have been broken, it becomes molten at a lower temperature than the other portions of the silicon body that are more atomically ordered. In general, it has been determined that the laser light must be applied over several pulses to ensure complete mixing of the metal in the silicon. Each laser pulse has a pulsewidth between 10 to 100 nanoseconds. The repetition rate of the laser pulses can be between 1 to 1000 Hertz. Between laser pulses, the substrate is allowed to cool to room temperature. To ensure that the irradiation step is performed within the process margin of the subject invention in which the amorphous region is rendered molten and the silicon body and the metal layer are maintained in their solid phases, the laser light should have a fluence in a range from 0.1 to 1.0 Joules per square centimeter delivered in a series of 3 to 10 shots of 10 to 100 nanoseconds in pulsewidth at a repetition rate of about 300 Hertz. The exact laser fluence, number of shots, shot duration and repetition rate that will be needed to operate within the process margin for the invented method will vary between different kinds of laser devices and the desired silicide thickness. For the Model No. 4308 laser commercially available from Lambda Physik, Inc. of Fort Lauderdale, Fla., the preferred fluence is 0.40 Joules per square centimeter, delivered in 10 shots of 30 nanosecond pulsewidth at a repetition rate of 300 Hertz. The irradiation of the metal layer 5 is preferably performed in a chamber with an inert atmosphere of nitrogen, argon or helium. A suitable chamber is the P-GILA machine commercially available from Ultratech Stepper, Inc. The inventors have determined that, with proper delivery of the laser light in accordance with the above-described guidelines and principles, the temperature window over which the amorphous region is molten while the silicon body and metal layer remain in their solid states, occurs over a relatively large range from 1150° to 1410° Celsius, a temperature difference range of about 300° Celsius. Thus, the invented methods greatly enhance the process margin available for successful performance of the invented method relative to conventional silicidation techniques.

Upon cooling after light irradiation, the previously amorphous region 4 becomes an alloy region that has the desired composition for the silicide that is to be formed on the silicon body. The alloy region has a partially-crystallized state in which the atoms of the silicide are relatively ordered, yet not entirely so. For $TiSi_2$ silicide, this partially crystallized phase is referred to as its 'C49 phase.' In FIG. 1D, the metal layer is stripped from the silicon body. The stripping of the metal layer can be performed with a 4:1 solution of sulfuric acid ($H_2SO_4$) and hydrogen peroxide ($H_2O_2$) heated to 120° Celsius. Typically, immersion of the silicon body for about ten minutes is all that is required to remove the metal layer, although the time necessary to strip the metal layer can vary to a degree depending upon the type of metal and its thickness. Immersion can be performed in a spray etch tool like the Equinox™ made by SEMITOOL™ of Kalispell, Mont.

The silicon body is then subjected to treatment to convert the alloy region 4 into a crystalline silicide region with the desired low-resistivity property. The crystalline silicide region is indicated by 'x' hatching in FIG. 1D. Preferably, rapid thermal annealing is used to convert the alloy region into a highly-crystalline silicide region. The rapid thermal treatment can be performed by subjecting the silicon body to a temperature of 700°–900° Celsius for a time duration ranging from 1 hour to 10 seconds. The specific temperature and time duration are selected within these ranges so that, if the temperature is relatively high, the treatment duration is relatively short, and vice versa. Preferably, for $TiSi_2$ silicide, the silicon body is subjected to rapid thermal annealing at a temperature of 850° Celsius for 20 seconds to convert the alloy region into the desired silicide. The atmosphere in which the silicon body is placed during rapid thermal annealing should be inert. Accordingly, for example, the rapid thermal annealing should be performed in a chamber containing a nitrogen atmosphere. The rapid thermal annealing can be performed in a Rapid Thermal Processing tool designated Centura that is commercially available from Applied Materials, Inc. of San Jose, Calif.

Figure 1D:
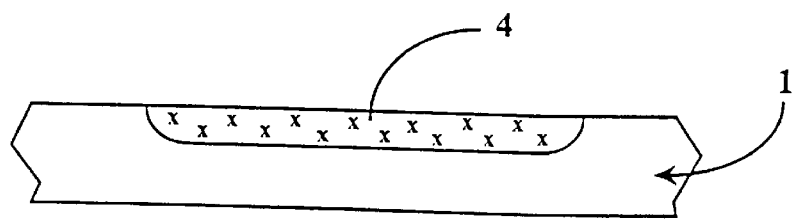
Figure 1E:
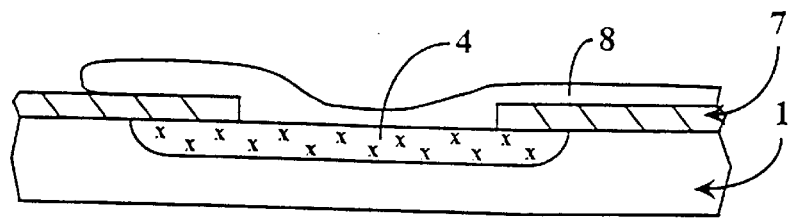

Once the silicide region 4 has been formed, a contact can be made to establish an electrical connection to the silicide, as shown in FIG. 1E. More specifically, an insulator layer 7 formed of $SiO_2$, for example, is formed on the silicon body 1, and patterned by selective etching or selective formation achieved through the use of a resist layer, for example, to expose the silicide region 4 through a window in the insulator layer. A conductive contact 8 is then formed on the insulator layer and patterned to form an electrical contact with the silicide region through the window in the insulator layer. The conductive contact can be formed on the insulator layer through sputtering, evaporation or chemical vapor deposition through selective formation of the conductive contact using a resist layer that is subsequently removed by etching, for example. Alternatively, the conductive contact can be formed on the insulator layer through formation of a metal layer that is selectively etched through areas exposed by a resist layer formed on the metal layer and that is subsequently removed. The conductive contact is thus formed to establish a low-resistivity electrical connection to the silicon body.

The invented method described above with reference to FIGS. 1A through 1E is relatively generalized, pertaining to the formation of a silicide region with one of a wide variety of possible compositions on any silicon body. The invented method can be applied to produce self-aligned silicide regions on a metal-insulator-semiconductor field-effect transistor (MISFET) (which term includes a 'MOSFET' within its meaning), as described hereinafter in FIGS. 2A through 2I.

Figure 2A:
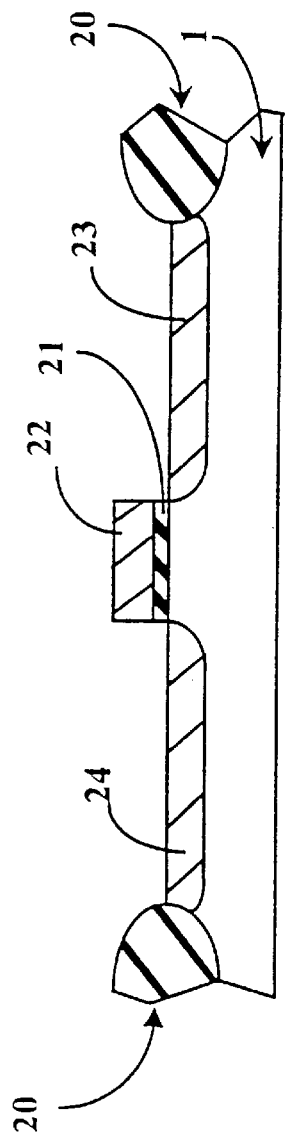

FIGS. 2A through 2I are cross-sectional diagrams of the invented method as applied to self-aligned silicidation of the contact regions for the gate, drain and source of an integrated MISFET device formed on a silicon body 1. In FIG. 2A, field insulator layers 20 are formed to electrically isolate an area of the silicon body in which the MISFET device is to be formed. As is well-known to average-skilled persons in this technology, a gate insulator layer 21 is formed on the surface of the silicon body 1. The gate insulator layer 21 can be an oxide layer, for example, in which case the resulting device is a MOSFET. A poly-silicon or amorphous silicon layer 22 is then deposited by low pressure chemical vapor deposition, for example, on the gate insulator layer 21. The silicon layer and gate oxide layer are patterned by using a resist layer to selectively form or etch the silicon layer and the gate insulator layer to form the silicon gate body 22 and the gate insulator layer 21, as shown in FIG. 2A. Drain and source regions 23, 24 are then doped with appropriate n- or p-type dopants. If the silicon body 1, and hence the MISFET channel, is p-type, the drain and source regions are doped with n-type dopants. On the other hand, if the silicon body 1 is n-type, the drain and source regions are doped with p-type dopants.

Figure 2B:
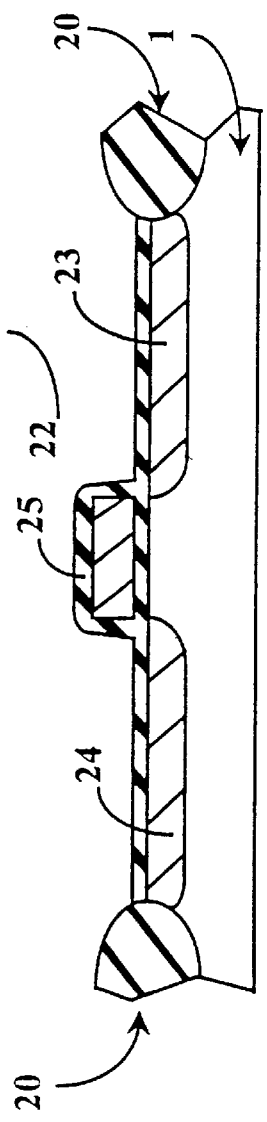

In FIG. 2B, an insulator layer 25 is formed over the silicon body 1 and the silicon gate body 22. The insulator layer 25 is then etched to form insulator side walls on the sides of the silicon gate body, as shown in FIG. 2C. The side walls 25 help to achieve self-alignment of the position of the silicide regions yet to be formed.

In FIG. 2D, ions 26 are implanted to form the amorphous regions 27, 28, 29 over the drain, source and gate regions, respectively. The ion species, implantation energies and dosages for the ion implantation are preferably as previously described with respect to FIG. 1A. If the amorphous regions are exposed to atmosphere, the surfaces of at least the amorphous regions 27, 28, 29 are stripped with an acidic solution to remove any native oxide film, as previously described with respect to FIG. 1B, that may have formed on the amorphous regions 27, 28, 29 upon exposure to the atmosphere.

Figure 2E:
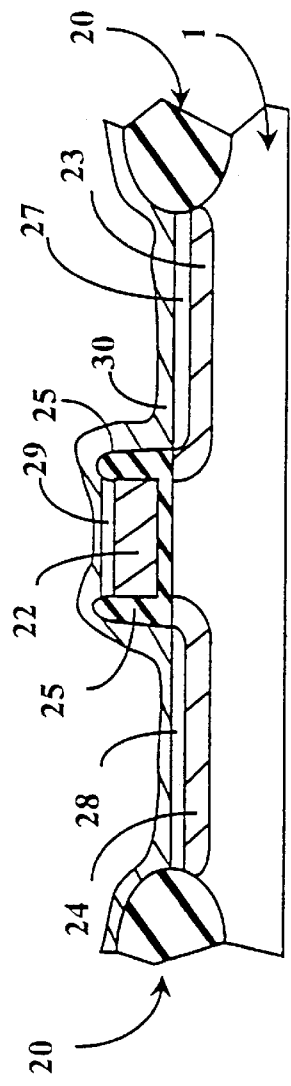

In FIG. 2E, a metal layer 30 is formed or positioned adjacent to at least the amorphous regions 27, 28, 29. Preferably, the metal layer 30 is a species such as titanium, cobalt or nickel formed on the amorphous regions by sputtering, evaporation or chemical vapor deposition, as previously described with respect to FIG. 1B.

Figure 2F:
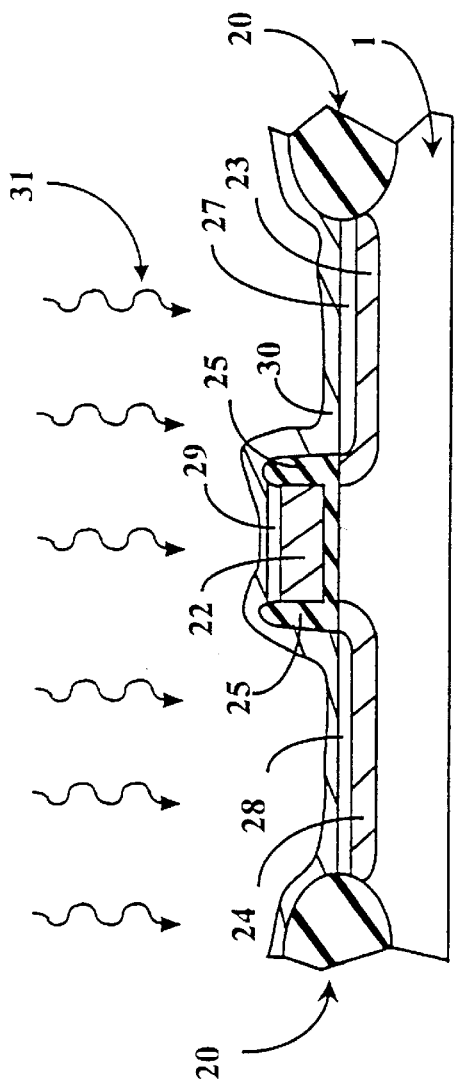

In FIG. 2F, the metal layer 30 is irradiated with light 31 of a fluence, number of shots, shot duration and repetition rate as previously described with respect to FIG. 1C. The light 31 heats the amorphous regions 27, 28, 29 sufficiently to render these regions molten, yet does not heat the silicon body 1, the gate silicon body 22, the gate insulator layer 21, the side walls 25 of the field insulator regions 20 to their respective melting temperatures. Accordingly, the silicon body, the gate silicon body, the gate insulator layer, the side walls, and the field insulator regions remain in their solid states. Due to the heating action of the light 31, metal atoms diffuse from the metal layer 30 into the melted amorphous regions 27, 28, 29 so that the amorphous regions 27, 28, 29 form respective alloy regions of silicide composition. After irradiation with the light 31, the alloy regions cool to a chemical form that is at least partially crystalline.

In FIG. 2G, the metal layer 30 is stripped from the surfaces of the field insulators 20, the side walls 25 and the alloy regions 27, 28, 29, preferably using an acidic solution as described with respect to FIG. 1D. In FIG. 2H, the alloy regions 27, 28, 29 are subjected to treatment to further crystallize the alloy regions into chemical forms with highly-ordered atomic structures so that the regions become silicide regions with the desired low-resistivity characteristics. The crystalline silicide regions 27, 28, 29 are indicated by 'x' hatching in FIG. 2H. Preferably, the treatment of the alloy regions to form respective silicide regions is preferably performed with rapid thermal annealing, as previously described with respect to FIG. 1D.

Figure 2I:
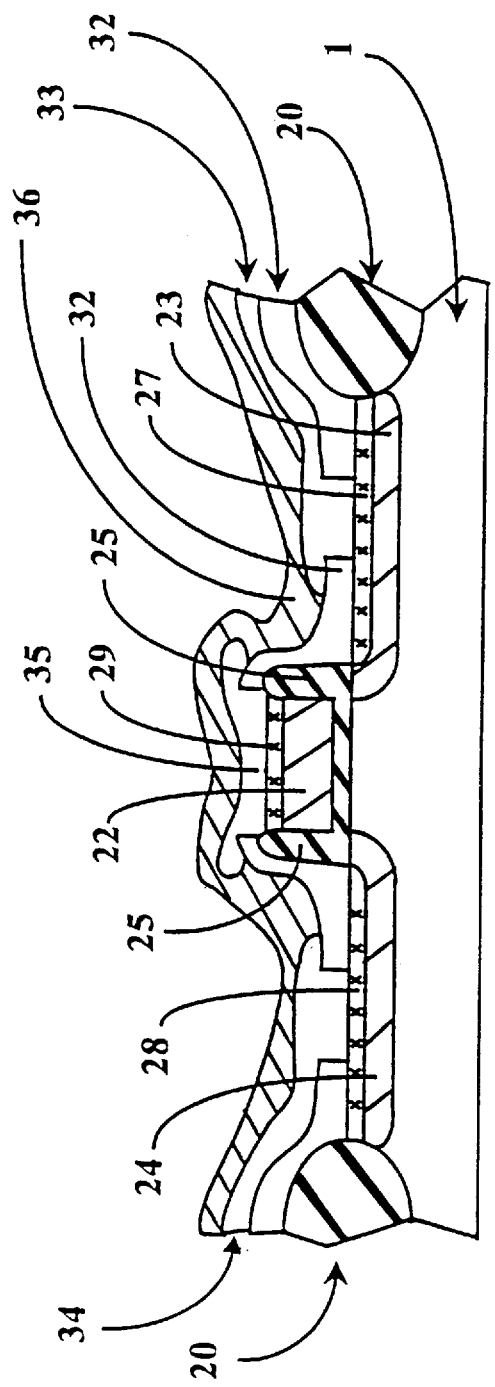

In FIG. 2I, an insulator layer 32 is formed on the field insulator regions 20, the silicide regions 27, 28, 29, and the side walls 25. The insulator layer 32 is selectively patterned to expose the silicide regions 27, 28, 29. Conductive leads 33, 34, 35 composed of aluminum or other conductive metal, are formed and patterned so as to make physical contact with the silicide regions 27, 28, 29 of the drain, source and gate, respectively, of the MISFET device. An insulator layer 36 composed of silicon oxide, for example, is formed over the conductive leads 33, 34, 35 to electrically insulate and protect the conductive leads and the MISFET device. At respective ends opposite those in contact with the silicide regions 27, 28, 29, the leads 33, 34, 35 are coupled to other electronic components, and/or power or signal sources.

Advantageously, with the method of this invention, the depth to which silicidation occurs is determined by the depth of the region(s) rendered amorphous through ion implantation. Because the depth of the amorphous region can be strictly controlled in accordance with the invented method through the selection of the ion species, implantation energy and dosage, the boundaries of the silicide region can be effectively controlled to avoid the formation of leakage paths and other problems that would otherwise adversely impact the electronic characteristics of the silicon body and/or any integrated devices formed thereon. Further, in the invented method, the use of light to irradiate the metal layer to diffuse the metal into the amorphous region helps to reduce heating of the silicon body so that integrated devices formed on the silicon body are not subjected to prolonged heating that could otherwise damage such devices, a problem that significantly reduces the effectiveness of conventional silicidation techniques. In the invented method, the laser heating of the amorphous region can be effectively accomplished within a process margin in which the amorphous region becomes molten while the silicon body and the metal layer remain in their solid phases, that spans a temperature range of 300° Celsius. Thus, the laser heating can deviate significantly from the optimum heating value in the middle of the temperature range without adverse impact to the silicon body or the alloy region resulting from laser irradiation. This feature of the invented method makes possible the formation of silicide contacts without significant increase in the risk of causing a leakage path or other defect in the silicon body or integrated device formed therein. In addition, the method of this invention can be used to perform silicidation at a much faster rate compared to conventional silicidation techniques, particularly those that require implantation of a stoichiometric quantity of metal ions to form the silicide region. In point of fact, the invented method requires implantation of only $10^{13}$ to $10^{15}$ ions per square centimeter, whereas conventional silicidation techniques require implantation on the order of $10^{16}$ to $10^{17}$ atoms per square centimeter, thus taking ten to ten-thousand times longer to perform in comparison to the invented method. Accordingly, the throughput for the silicidation of silicon bodies using the invented method is much greater than possible with conventional silicidation techniques. Moreover, with ion implantation of the scale needed to implant a stoichiometric quantity of metal ions required in conventional silicidation techniques, the occurrence of 'knock-on' and hence the formation of leakage paths, is undesirably increased. In contrast, the relatively low ion implantation dosages required by the invented method minimize the probability of knock-on on a scale that could adversely affect the silicon body or its integrated devices.

The many features and advantages of the present invention are apparent from the detailed specification and thus, it is intended by the appended claims to cover all such features and advantages of the described method which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the invention.

We claim:

1. A method comprising the steps of:
    a) producing an amorphous region having a predetermined depth on a silicon body;
    b) forming a metal layer in contact with the amorphous region;
    c) irradiating the metal layer with laser light to diffuse metal into the amorphous region to form an alloy region of silicide composition from the amorphous region, wherein said laser light has a fluence that causes the amorphous region to melt while the metal layer and the silicon body remain in solid state; and
    d) treating the alloy region to form a silicide region from the alloy region having a resistivity of less than 30 $\mu\Omega$cm.

2. A method as claimed in claim 1, wherein said step (d) includes a substep of subjecting at least the alloy region to rapid thermal annealing.

3. A method as claimed in claim 1, wherein the silicide region is formed on at least one of a gate, drain and source region of a transistor, further comprising the step of:
  e) patterning at least one insulator layer and at least one conductive layer to form a conductive path that contacts the silicide region.

4. A method as claimed in claim 1, wherein said step (a) includes a substep of implanting ions in the silicon body to form the amorphous region.

5. A method as claimed in claim 4, wherein the ions include at least one of silicon, argon, arsenic and germanium.

6. A method as claimed in claim 5, wherein the ions are implanted with an energy in a range from 10 to 100 kilo-electronVolts (keV).

7. A method as claimed in claim 5, wherein the substep of implanting is performed with a dosage in a range from $10^{13}$ to $10^{15}$ atoms per square centimeter.

8. A method as claimed in claim 4, further comprising the step of:
  e) selecting at least one of ion species, ion energy and ion dosage to form the amorphous region to the predetermined depth,
  said implanting substep performed based on said step (d).

9. A method as claimed in claim 1, further comprising the step of:
  e) stripping an oxide layer from the silicon body after performing said step (a) and before performing said step (b).

10. A method as claimed in claim 9, wherein said step (d) includes a substep of immersing the silicon body in an acidic bath.

11. A method as claimed in claim 1, wherein said step (b) includes a substep of sputtering metal onto the amorphous region to form the metal layer.

12. A method as claimed in claim 11, wherein the metal includes at least one of titanium, cobalt, and nickel.

13. A method as claimed in claim 1, wherein said step (b) includes a substep of evaporating metal onto the amorphous region to form the metal layer.

14. A method as claimed in claim 1, wherein said step (b) includes a substep of forming the metal layer on the amorphous region by chemical vapor deposition.

15. A method as claimed in claim 1, wherein the metal layer is formed with a thickness greater than the predetermined depth to which the amorphous region is formed in the silicon body, divided by a consumption ratio of silicon to metal.

16. A method as claimed in claim 1, wherein said step (c) includes a substep of irradiating the metal layer with laser light.

17. A method as claimed in claim 16, wherein the metal layer is irradiated by the laser light in a series of shots.

18. A method as claimed in claim 1, wherein the fluence is in a range from 0.1 to 1.0 Joules per square centimeter.

19. A method as claimed in claim 1, wherein the silicon body is situated in an ambient medium including at least one of argon, helium and nitrogen during performance of said step (c).

20. A method comprising the steps of:
  a) forming a first insulator layer on a silicon substrate;
  b) patterning the first insulator layer to produce a gate insulator layer;
  c) forming a silicon region over the gate insulator layer;
  d) patterning the silicon region to produce a gate silicon region over the gate insulator layer;
  e) doping at least regions of the silicon substrate adjacent the gate silicon region to form drain and source regions on the silicon substrate;
  f) forming a second insulator layer over the gate silicon region and the silicon substrate;
  g) etching the second insulator layer to form side walls in contact with the side of the gate silicon region;
  h) producing at least one amorphous region in at least one of the gate, source and drain;
  i) forming a metal layer in contact with the amorphous region;
  j) irradiating the metal layer with laser light to diffuse metal into the amorphous region to form an alloy region of silicide composition from the amorphous region;
  k) removing the metal layer; and
  l) treating the alloy region to form a silicide region.

21. A method as claimed in claim 20, further comprising the steps of:
  m) forming a third insulator layer over the silicon substrate;
  n) patterning the third insulator layer to selectively expose the source, gate and drain regions; and
  o) forming conductive leads on the third insulator layer that contact the source, gate and drain regions.

22. A method as claimed in claim 20, wherein said step (h) includes a substep of implanting ions to form the amorphous region.

23. A method as claimed in claim 20, wherein said step (i) includes a step of sputtering the metal layer onto the amorphous region.

24. A method comprising the steps of:
  a) amorphizing a region of a silicon body;
  b) positioning metal in contact with the amorphized region;
  c) irradiating the amorphized region with light of a power sufficient to melt the amorphized region, yet insufficient to melt the metal and the silicon body, so that metal diffuses into the amorphized region to form an alloy region of silicide composition;
  d) removing the metal from the silicon body; and
  e) forming a silicide region from the allow region.

25. A method as claimed in claim 24, wherein said step (e) includes a substep of rapid thermal annealing of the alloy region to produce the silicide region.

26. A method as claimed in claim 24, wherein said step (a) includes a substep of implanting ions into the silicon body to produce the amorphized region.

27. A method as claimed in claim 24, wherein said step (b) includes a substep of sputtering the metal onto the amorphized region.

28. A method as claimed in claim 24, wherein said step (b) includes a substep of evaporating the metal onto the amorphized region.

29. A method as claimed in claim 24, wherein said step (b) includes a substep of forming the metal in contact with the amorphized region using chemical vapor deposition.

30. A method as claimed in claim 24, wherein said step (c) includes a substep of irradiating the metal with laser light having a fluence in a range from 0.1 to 1.0 Joules per square centimeter.

31. A method as claimed in claim 30, wherein said step (c) includes a substep of irradiating the laser light in a series of shots.

32. A method as claimed in claim 31, wherein a predetermined number of shots in a range from 3 to 10 are delivered to the metal with a duration of 10 to 100 nanoseconds for each shot.

* * * * *

UNITED STATES PATENT AND TRADEMARK OFFICE
CERTIFICATE OF CORRECTION

PATENT NO.    : 5,888,888
DATED         : March 30, 1999
INVENTOR(S)   : Somit Talwar, Guarav Verma, Karl-Josef Kramer and Kurt Weiner It is certified that error appears in the above-identified patent and that said Letters Patent is hereby corrected as shown below:

Column 1,
Line 3, to be inserted after the title and before BACKGROUND OF THE INVENTION:

Government Rights
This invention was made with Government support under contract number N66001-95-C-8002 awarded by the Space and naval Warfare Systems Command, San Diego. The Government has certain rights in the invention.

Signed and Sealed this

Sixteenth Day of October, 2001

Attest:

Nicholas P. Godici

Attesting Officer

NICHOLAS P. GODICI
Acting Director of the United States Patent and Trademark Office